US011923269B2

(12) United States Patent
Schultz et al.

(10) Patent No.: US 11,923,269 B2
(45) Date of Patent: Mar. 5, 2024

(54) CO-PACKAGED OPTICAL MODULE

(71) Applicant: International Business Machines Corporation, Armonk, NY (US)

(72) Inventors: Mark D. Schultz, Ossining, NY (US); Fuad Elias Doany, Katonah, NY (US); Benjamin Giles Lee, Ridgefield, CT (US); Daniel M. Kuchta, Patterson, NY (US); Christian Wilhelmus Baks, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 17/225,075

(22) Filed: Apr. 7, 2021

(65) Prior Publication Data
US 2022/0328375 A1 Oct. 13, 2022

(51) Int. Cl.
*H01L 23/367* (2006.01)
*G02B 6/42* (2006.01)
*H01L 25/16* (2023.01)
*H01L 23/498* (2006.01)

(52) U.S. Cl.
CPC ........ *H01L 23/3675* (2013.01); *G02B 6/4269* (2013.01); *H01L 25/167* (2013.01); *H01L 23/49833* (2013.01)

(58) Field of Classification Search
CPC ............... H01L 23/3675; H01L 25/167; H01L 23/49833; G02B 6/4269
See application file for complete search history.

(56) References Cited

U.S. PATENT DOCUMENTS

| | | | | |
|---|---|---|---|---|
| 6,955,481 B2* | 10/2005 | Colgan | ................ | G02B 6/4214 |
| | | | | 385/88 |
| 7,544,527 B2* | 6/2009 | Benner | ................ | G02B 6/4212 |
| | | | | 385/115 |
| 9,557,478 B2 | 1/2017 | Doerr | | |
| 9,678,271 B2 | 6/2017 | Thacker | | |
| 9,829,661 B2 | 11/2017 | Pinguet | | |
| 9,847,271 B2* | 12/2017 | Miura | ................ | G02B 6/4269 |
| 9,874,688 B2 | 1/2018 | Doerr | | |
| 10,025,047 B1 | 7/2018 | Liu | | |
| 10,342,160 B2* | 7/2019 | Achard | ................ | H05K 7/2039 |
| 10,598,875 B2 | 3/2020 | Xie | | |
| 10,877,217 B2 | 12/2020 | Byrd | | |
| 10,996,412 B2* | 5/2021 | Perminjat | ................ | G02B 6/43 |
| 2004/0218372 A1* | 11/2004 | Hamasaki | ............ | H05K 1/0263 |
| | | | | 361/767 |
| 2006/0182397 A1* | 8/2006 | Benner | ................ | G02B 6/4269 |
| | | | | 385/89 |
| 2008/0118202 A1 | 5/2008 | Kato | | |
| 2011/0294308 A1 | 12/2011 | Kuwata | | |

(Continued)

*Primary Examiner* — Eugene Lee
(74) *Attorney, Agent, or Firm* — Grant M. McNeilly

(57) ABSTRACT

An optical module includes an optoelectronic assembly and a heat spreader. The optoelectronic assembly includes a flat, rigid substrate, an array of electrical contacts positioned on a first portion of the substrate, and an optoelectronics assemblage that is electrically connected to the array of contacts and is positioned apart from the array of electrical contacts. The heat spreader is comprised of a thermally conductive material and comprises a second portion that is structurally connected to the first portion and a third portion that is thermally connected to the optoelectronics assemblage.

13 Claims, 8 Drawing Sheets

(56) References Cited

U.S. PATENT DOCUMENTS

| | | | |
|---|---|---|---|
| 2014/0029639 A1* | 1/2014 | Zarbock | G02B 6/4269 372/50.1 |
| 2014/0321803 A1* | 10/2014 | Thacker | G02B 6/4274 385/14 |
| 2015/0003841 A1* | 1/2015 | McLaren | G02B 6/43 398/141 |
| 2018/0114785 A1* | 4/2018 | Budd | H01S 5/18361 |
| 2020/0219865 A1 | 7/2020 | Nelson | |
| 2021/0225824 A1* | 7/2021 | Islam | G02B 6/4269 |

\* cited by examiner

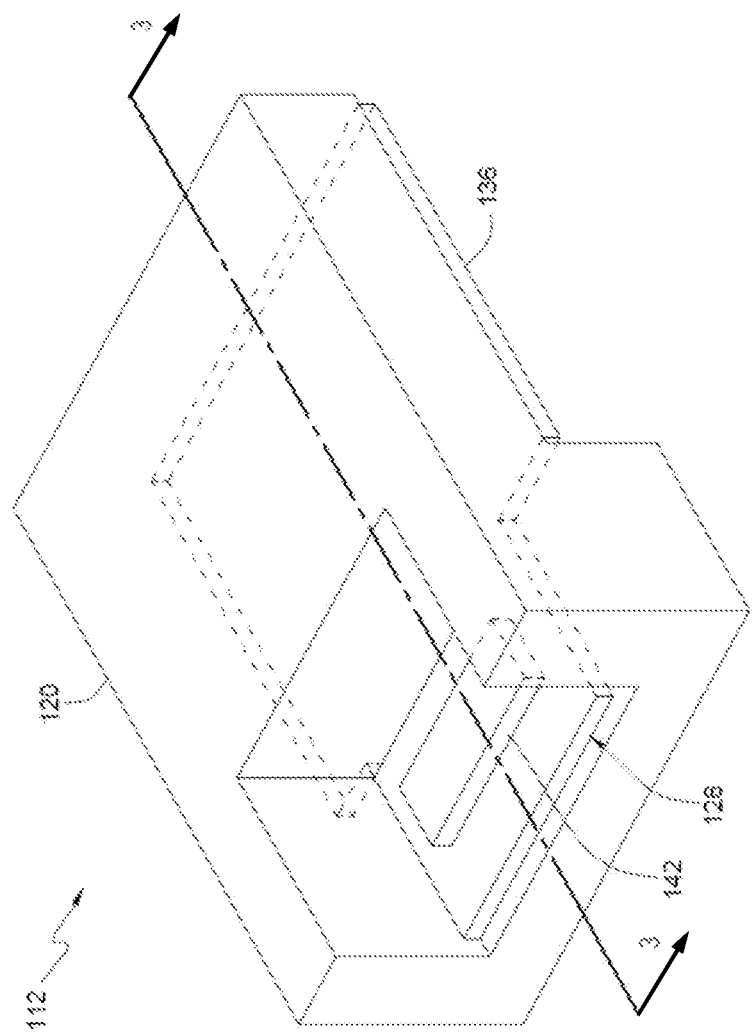

CO-PACKAGED OPTICAL MODULE

STATEMENT OF GOVERNMENT INTEREST

This invention was made with government support under B621073 awarded by the U.S. Department of Energy. The government has certain rights to this invention.

BACKGROUND

The present invention relates to heat removal for a multi-chip module, and more specifically, to a heat spreader for an optical module.

Fiber-optic communication are commonly used between systems within a data center, and they may also be used for communication between components within a system. In such implementations, optical modules can be coupled to silicon components (e.g., microprocessors, graphics processing units) and be mounted on the same surface of the same substrate that the silicon is connected to. This can be known as "co-packaged optics". However, the operation of the optical module can produce heat, and with increasing bandwidth comes increasing heat loads. This heat can have negative effects on the components of a multi-chip module unless it is properly managed.

SUMMARY

According to an embodiment of the present disclosure, an optical module includes an optoelectronic assembly and a heat spreader. The optoelectronic assembly includes a flat, rigid substrate, an array of electrical contacts positioned on a first portion of the substrate, and an optoelectronics assemblage that is electrically connected to the array of contacts and is at least partially positioned apart from the array of electrical contacts. The heat spreader is comprised of a thermally conductive material and comprises a second portion that is structurally connected to the first portion and a third portion that is thermally connected to the optoelectronics assemblage.

According to an embodiment of the present disclosure, an electronics assembly includes a circuit board comprising a substrate, and a die mounted on the substrate. The electronics assembly further includes an optical module comprising a heat spreader that is structurally connected to the circuit board and extends from inboard of the substrate to outboard of the substrate, and an optoelectronics assemblage that is thermally connected to the heat spreader and is outboard of the substrate.

According to an embodiment of the present disclosure, a method of manufacturing a computer assembly includes connecting, structurally and thermally, an optoelectronics assemblage to a first component of a heat spreader, connecting, structurally, a substrate to the first component, the substrate comprising a contact array and a plurality of traces extending from the contact array, connecting, electrically, the optoelectronics assemblage to the plurality of traces, and connecting, structurally and thermally, the first component to a second component of the heat spreader.

BRIEF DESCRIPTION OF THE DRAWINGS

One or more aspects of the present disclosure are particularly pointed out and distinctly claimed as examples in the claims at the conclusion of the specification. The foregoing and other objects, features, and advantages of the disclosure are apparent from the following detailed description taken in conjunction with the accompanying drawings in which:

FIG. 2A is a perspective view of an optical module, in accordance with an embodiment of the present disclosure.

DETAILED DESCRIPTION

Figure 1:
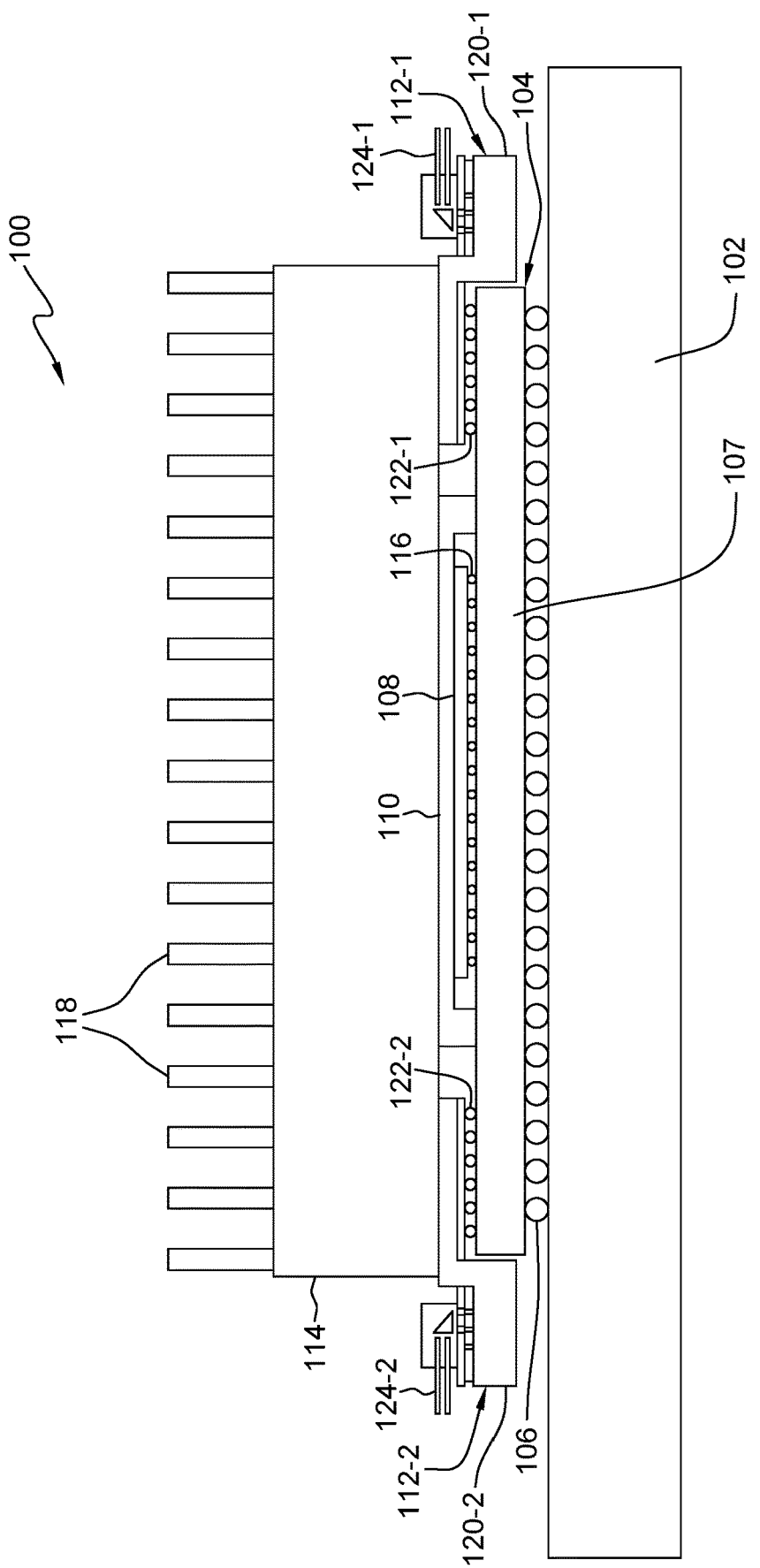
FIG. 1 is a side view of a main circuit board assembly, in accordance with an embodiment of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary between the two elements.

FIG. 1 is a side view of main circuit board (MCB) assembly 100 for a larger system (not shown) such as, for example, a computer or a network switch. MCB assembly 100 includes MCB 102 (a.k.a., mainboard, baseboard, or motherboard) and multi-chip module (MCM) 104 which is mounted to MCB 102 at connections 106 using, for example, metallic solder joints (e.g., in a ball grid array) or a socket (e.g., with land and pin grid arrays).

In the illustrated embodiment, MCM 104 is a circuit board that includes MCM board 107, die 108, thermal lid 110, optical modules 112-1 and 112-2 (collectively "optical modules 112), and heat sink 114. Die 108 includes an integrated circuit and is mounted to MCM board 107 at connections 116 using, for example, metallic solder joints (e.g., in a ball grid array) or a socket (e.g., with land and pin grid arrays). To dissipate the heat from the operation of die 108, thermal lid 110 extends over and around die 108 and is thermally connected thereto. Thermal lid 110 is comprised of a thermally conductive material, such as, for example, a metal (e.g., copper), and it is also thermally connected to heat sink 114. Heat sink 114 is also comprised of thermally conductive material, such as, for example, a metal (e.g., copper or aluminum), and includes an array of cooling fins 118. In other embodiments, heat sink 114 can include pipes instead of or in addition to cooling fins 118, such that heat sink 114 can be cooled or heated using a fluid, such as, for example, a pressurized gas or liquid (e.g., water).

Similarly, optical modules 112 each include heat spreaders 120-1 and 120-2 (collectively "heat spreaders 120"), respectively, which are comprised of thermally conductive material, such as, for example, copper. Heat spreaders 120 are thermally connected to heat sink 114 in order to dissipate heat generated from the operation of optical modules 112. Optical modules 112 also include integrated circuits (e.g., optoelectronic assembly 126, shown in FIG. 2C), which are electrically connected to MCM board 107 at connections 122-1 and 122-2 (collectively "connections 122"), respectively, using, for example, metallic solder joints (e.g., in a ball grid array) or a socket (e.g., with land and pin grid arrays). In addition, connections 122 (which can include an underfill material, e.g., an adhesive such as glue or epoxy, not shown) structurally connect optical modules 112 to MCM board 107, respectively.

In some embodiments, heat sink 114 is thermally and structurally connected to thermal lid 110 and heat spreaders 120 using, for example, thermally conductive epoxy (a.k.a., thermal epoxy). In other embodiments, heat sink 114 is thermally, but not structurally, connected to thermal lid 110 and heat spreaders 120 using a thermal interface material (TIM) pad comprised of, for example, graphite or indium. In such embodiments, heat sink 114 can be more easily removed from thermal lid 110 and heat spreaders 120.

In the illustrated embodiment, optical modules 112 are connected to fiber-optic cables 124-1 and 124-2 (collectively "fiber-optic cables 124"), respectively. In some embodiments, fiber-optic cables 124 connect to the tops of optical modules 112 (as shown in FIG. 1), although in other embodiments, fiber-optic cables 124 connect to the periphery of the outboard portions of optical modules 112. In either embodiments, the locations where fiber-optic cables 124 connect to optical modules 112, respectively, are accessible without removing optical modules 112 and/or heat sink 114. Fiber-optic cables 124 can carry signals from MCB assembly 100 (including MCM 104) to other components (not shown) such as other MCB assemblies. The locations of the connections of fiber-optic cables 124 to optical modules 112 are laterally outboard of the outer edges of MCM 104 (i.e., outside of the footprint of MCM 104 as projected onto MCB 102). This allows for heat sink 114 to have a relatively, if not completely, flat bottom because the portions of optical modules 112 that are under heat sink 114 can be similar in height (e.g., within 1 millimeter (mm) of each other), if not coplanar, with the top of thermal lid 110. In some embodiments, thermal lid 110 is absent. In such embodiments, die 108 is directly thermally connected to heat sink 114, and the top surface of die 108 can be similar in height or coplanar with the tops of optical modules 112. However, any significant differences in height can be accommodated by contouring or selectively relieving the bottom of heat sink 114.

Figure 2B:
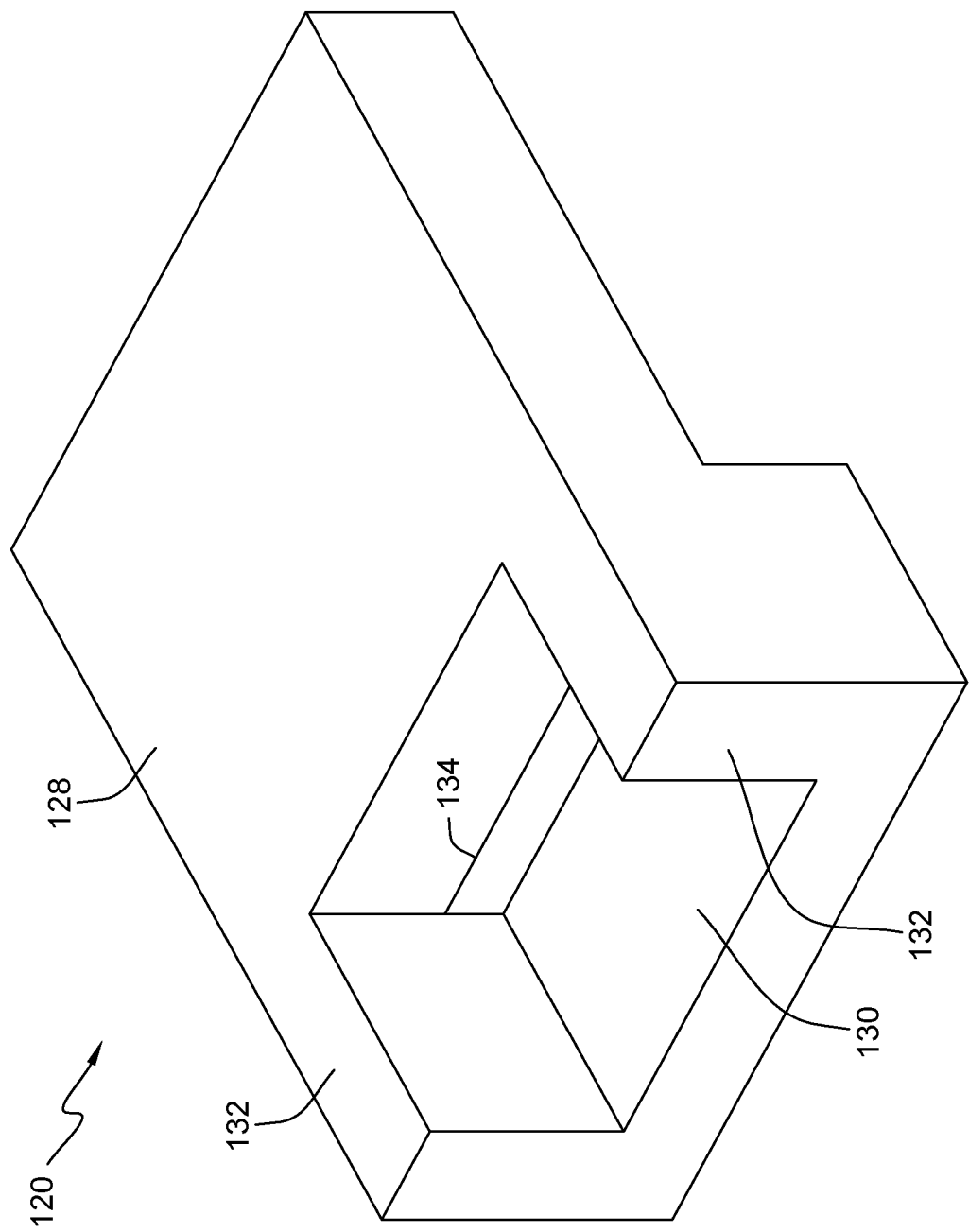
FIG. 2B is a perspective view of a heat spreader, in accordance with an embodiment of the present disclosure.
Figure 2C:
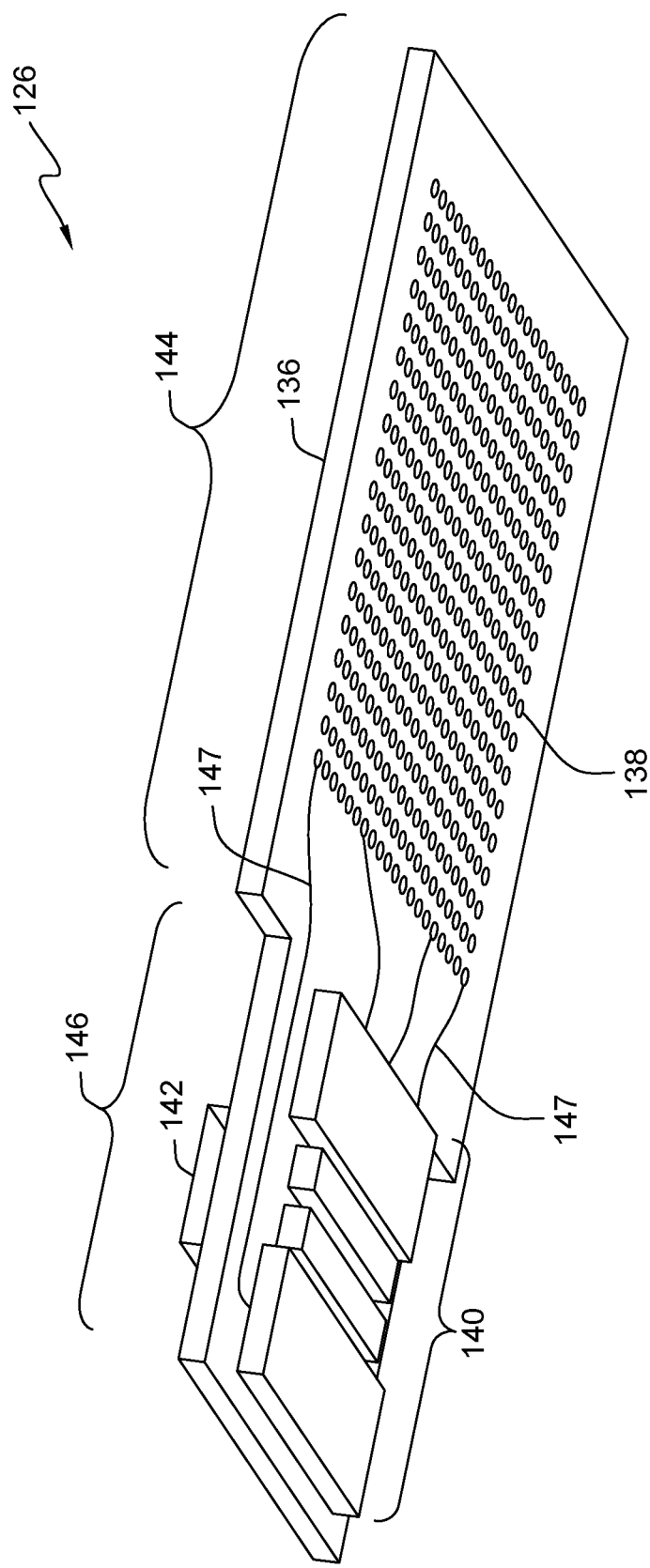
FIG. 2C is a perspective view of an optical-electronic (OE) assembly, in accordance with an embodiment of the present disclosure.

FIG. 2A is a perspective view of an example optical module 112 (e.g., optical module 112-2 in FIG. 1). FIG. 2B is a perspective view of an example heat spreader 120 (e.g., heat spreader 120-2 in FIG. 1). FIG. 2C is a perspective view of an example optoelectronic assembly 126. FIGS. 2A-2C will now be discussed in conjunction with one another.

In the illustrated embodiment, optical module 112 comprises heat spreader 120 and optoelectronic assembly 126. Heat spreader 120 is a unitary, monolithic component that comprises base 128, lip 130, and connecting portions 132. Base 128 is a flat portion of heat spreader 120 that extends laterally and is positioned between MCM board 107 and heat sink 114 (shown in FIG. 1). Lip 130 is flat and parallel to base 128 but is laterally offset and positioned at a different elevation. Lip 130 is connected to base 128 by connecting portions 132 that are walls extending perpendicular to base 128 and lip 130. Because the bottom of base 128 is above the top of lip 130, aperture 134 exists and is bordered by base 128, lip 130, and connecting portions 132. In addition, because lip 130 is cantilevered outward from base 128, lip 130 is only thermally connected to heat sink 114 through connecting portions 132 and base 128.

In some embodiments, base 128 has a square shape with sides that are about 10 mm long and a thickness of about 2 mm to 3 mm. In some embodiments, lip 130 has a thickness of about 1 mm to 2 mm, and aperture 134 is less than about 1 mm in height. These dimensions can be employed, for example, with reference to MCM board 107, which can have a square shape with sides that are about 50 mm to 70 mm long, although sides of 100 mm or longer are also possible. These dimensions are merely exemplary, and thermal modeling can be used to determine the absolute and/or relative dimensions of heat spreader 120 (e.g., to make sure that connecting portions 132 are thick enough to conduct the heat from lip 130 to base 128).

In the illustrated embodiment, optoelectronic assembly 126 comprises substrate 136, contact array 138, optoelectronics assemblage 140, and optical coupler 142. In some embodiments, substrate 136 is a rigid organic laminate material, although in other embodiments, substrate 136 is a silicon material. Substrate 136 has a flat, planar shape, for example, about 0.5 mm to 0.7 mm thick with a height variation of no more than 10% the length or width of substrate 136. Substrate 136 extends parallel to MCM board 107 and includes wired portion 144 and optical portion 146. Substrate 136 extends through aperture 134 with wired portion 144 being positioned near to base 128 and optical portion 146 being positioned near to lip 130. In some embodiments, the top of wired portion 144 is structurally connected to base 128 using, for example, glue or epoxy. This connection may make use of thermally conductive adhesive.

In the illustrated embodiment, contact array 138 is positioned on wired portion 144 and is used to make connections 122 with MCM board 107 (shown in FIG. 1). Contact array 138 (or certain contacts thereof) are connected to traces 147 along the top and/or bottom of substrate 136, although in other embodiments, contact array 138 can have a multi-layer configuration wherein some of the contacts are positioned within substrate 136. Traces 147 are connected to optoelectronics assemblage 140 to electrically connect elements of MCM 104 with optoelectronics assemblage 140. Optoelectronics assemblage 140 is positioned on the bottom side of optical portion 146 and is in thermal contact with heat spreader 120. Therefore, optoelectronics assemblage 140 is positioned on a level offset from the bottom side of base 128 (i.e., outside of a lateral projection of base 128). Optoelectronics assemblage 140 includes integrated circuits and other hardware for optical communications and is optically connected to optical coupler 142. Optical coupler 142 is positioned on the top side of optical portion 146 and serves as an interface with fiber-optic cable 124 (shown in FIG. 1). Optical coupler 142 is a coupling element configured to interface with fiber-optic cable 124, such as, for example, a pluggable connector interface or a lens (e.g., lenses 156, shown in FIG. 3A).

During operation of MCM 104, a substantial amount of communication signals can be passed through (i.e., output and input) optoelectronics assemblage 140. This activity can cause optoelectronics assemblage 140 to consume a substantial amount of electrical power, which can in turn produce a substantial amount of heat. In some embodiments, this heat can be conducted through lip 130, connecting portions 132, and base 128, and then the heat can be dissipated through heat sink 114. In other embodiments, lip 130 is connected to an auxiliary heat sink (not shown) and/or has its own fins, for example, extending from the bottom (not shown).

The components and configuration of optical module 112 allow for optoelectronics assemblage 140 to be electrically connected to MCM 104 but be positioned apart from contact array 138 (i.e., optoelectronics assemblage 140 is not within the perimeter of contact array 138 or amongst contact array 138), spaced apart from wired portion 144, and outboard of the edge of MCM 104. In contrast with having optoelectronics assemblage 140 integrated into wired portion 144, wired portion 144 is reduced in size. This allows for wired portion 144 to be large enough to accommodate contact array 138 but not having to accommodate optoelectronics assemblage 140 as well. Thereby, optical module 112 occupies a reduced amount of space on MCM 104, which allows for MCM 104 to incorporate more features than it otherwise could have. This arrangement also allows for more contact between base 128 and heat sink 114, which increases the heat transfer rate therebetween. Although, in some embodiments, a portion of optoelectronics assemblage 140 is positioned apart from contact array 138, and another portion is positioned within the perimeter of contact array 138. In such embodiments, some space on MCM 104 would still be conserved for other components compared to having all of optoelectronics assemblage 140 positioned amongst contact array 138. In addition, heat is removed from optoelectronics assemblage 140 on the same side of optical module 112 that connections 122 are on (e.g., the bottom side). This heat is conducted from outboard of the edge of MCM 104 to inboard of the edge of MCM 104 (due to heat spreader 120 being both inboard and outboard of the edge of MCM 104), so the heat can be subsequently transferred to heat sink 114 and dissipated thereby.

Figure 3A:
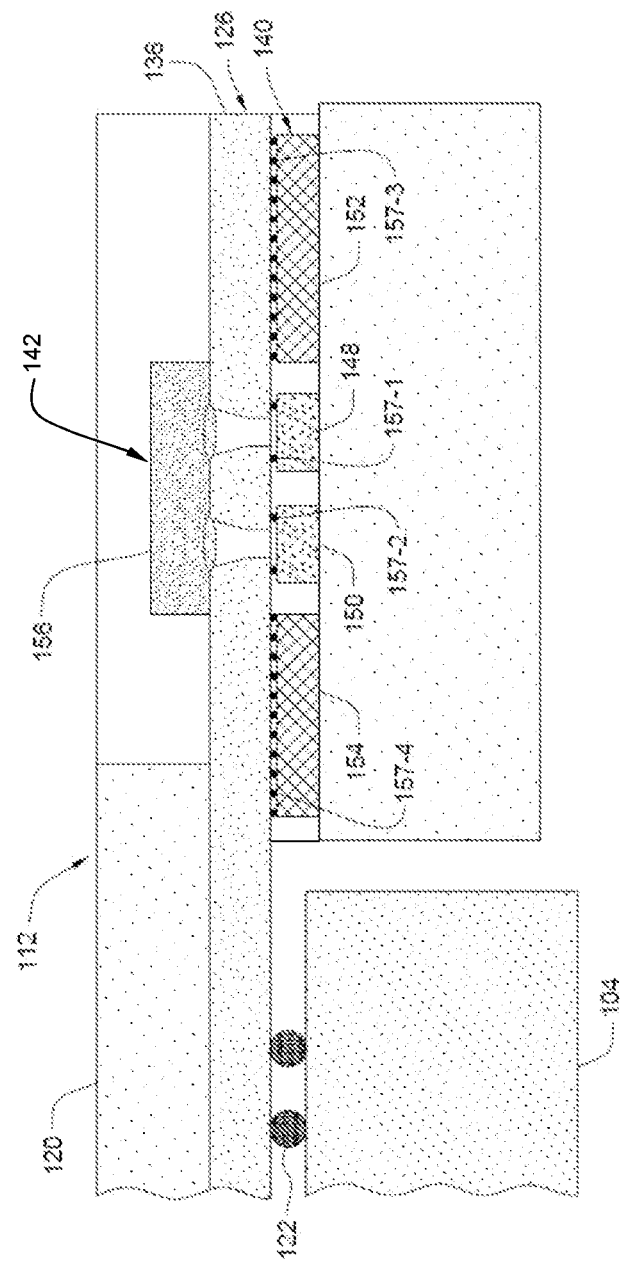
FIG. 3A is a cross-section view of a portion of the main circuit board assembly along line 3-3 in FIG. 2A, in accordance with an embodiment of the present disclosure.

FIG. 3A is a cross-section view of a portion of MCB assembly 100 (e.g., including optical module 112-1, shown in FIG. 1) along line 3-3 in FIG. 2A. As stated previously, optical module 112 comprises heat spreader 120 and optoelectronic assembly 126, the latter of which comprises optoelectronics assemblage 140. Optoelectronics assemblage 140 includes the components of optoelectronic assembly 126 that consume electrical power and generate heat, so optoelectronics assemblage 140 comprises photodiode 148, vertical-cavity surface-emitting laser (VCSEL) 150, transimpedance amplifier (TIA) 152, and driver 154. Photodiode 148 is configured to receive optical signals from fiber-optic cable 124 (shown in FIG. 1), and TIA 152 is an integrated circuit configured to convert those optical signals into electrical signals for MCM 104. Thereby, photodiode 148 and TIA 152 are electrically connected via traces (not shown) in substrate 136. VCSEL 150 is configured to create optical signals, and driver 154 is an integrated circuit configured to convert electrical signals from MCM 104 into optical signals by controlling VCSEL 150. Thereby, VCSEL 150 and driver 154 are electrically connected via traces (not shown) in substrate 136. In addition, optoelectronic assembly 126 includes lenses 156 which focus the optical signals as they enter or exit from optoelectronic assembly 126.

In the illustrated embodiment, optoelectronics assemblage 140 has a flip-chip configuration. This means that photodiode 148, VCSEL 150, TIA 152, and driver 154 are electrically connected to substrate 136 at connections 157-1, 157-2, 157-3, and 157-4 (collectively "connections 157"), respectively. using, for example, metallic solder joints (e.g., in a ball grid array) or a socket (e.g., with land and pin grid arrays). In addition, connections 157 (which can include an underfill material, e.g., an adhesive such as glue or epoxy, not shown) structurally connect optoelectronics assemblage 140 to substrate 136. Lenses 156 can also be structurally connected to substrate 136 using, for example, an adhesive, such as glue or epoxy. Furthermore, photodiode 148, VCSEL 150, TIA 152, and driver 154 are thermally connected to heat spreader 120, for example, using a TIM. The TIM can be structural (e.g., an epoxy that is a good thermal conductor, known as a "thermal epoxy") or a softer, non-structural material (e.g., a non-rigid, cured thermal gel material, a thermal paste, or a thermal grease). The TIM may also be electrically conductive, (e.g., an epoxy that is a good thermal and electrical conductor, known as a "thermoelectric epoxy").

While this embodiment shows one pairing of photodiode 148 and VCSEL 150 and one pairing of TIA 152 and driver 154, there can be multiple pairings of input hardware (i.e., photodiode 148 and VCSEL 150) and output hardware (i.e., TIA 152 and driver 154) across optical portion 146. In some embodiments, the input and output pairs are across from each other (as shown in FIG. 3A), but in other embodiments, they alternate. In such embodiments, an input pair does not have an output pair across from itself, but rather the output pair is alongside the input pair. Such variations can also apply the foregoing alternate embodiments. In addition, in other embodiments, photodiode 148, TIA 152 and driver 154 are implemented as a single silicon photonic die (not shown) with grating couplers for the optical inputs and outputs (i.e., in place of optical coupler 142). In such embodiments, VCSEL 150 can be replaced by a different type of laser light source, for example, an external laser light source that is connected to the silicon photonic die through an additional optical fiber (not shown) that connects through lenses 156.

Figure 3B:
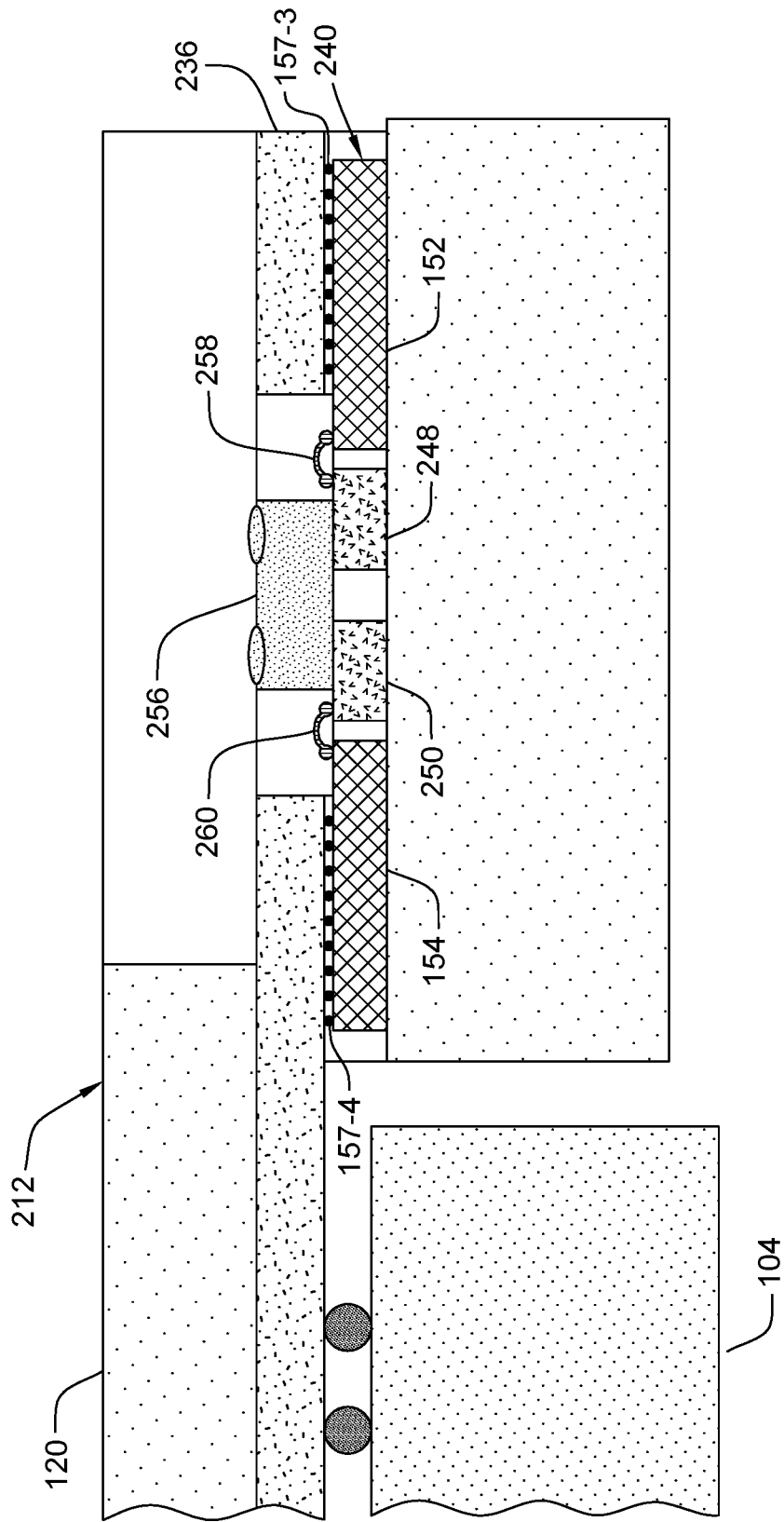
FIG. 3B is a cross-section view of a portion of an alternative optical module of the main circuit board assembly along line 3-3 in FIG. 2A, in accordance with an embodiment of the present disclosure.

FIG. 3B is a cross-section view of a portion of alternative optical module 212 of MCB assembly 100 along line 3-3 in FIG. 2A. In the illustrated embodiment, optical module 212 is similar to optical module 112 (shown in FIG. 3A) except that optoelectronics assemblage 240 has a hybrid flip-chip/wirebond configuration. Thereby, the same reference numerals will be used for optical module 212 where the corresponding components are the same as in optical module 112. However, reference numerals that are one hundred higher are used for components of optical module 212 that are different from those in optical module 112.

In the illustrated embodiment, the hybrid flip-chip/wirebond configuration of optical module 212 means that TIA 152 and driver 154 are structurally connected to substrate 236, for example, using connections 157-3 and 157-4. In addition, TIA 152, and driver 154 are thermally connected to heat spreader 120 using a structural or nonstructural TIM, for example, using thermal epoxy or a softer material (e.g., a non-rigid, cured thermal gel material). However, photodiode 248 and VCSEL 250 are structurally and thermally connected to heat spreader 120, for example, using thermal epoxy. Thereby, photodiode 248 and TIA 152 are electrically connected via wirebond array 258, and VCSEL 250 and driver 154 are electrically connected via wirebond array 260. In addition, lenses 256 is optically connected to photodiode 248 and VCSEL 250, and in some embodiments, lenses 256 is structurally connected to photodiode 248 and VCSEL 250.

Figure 3C:
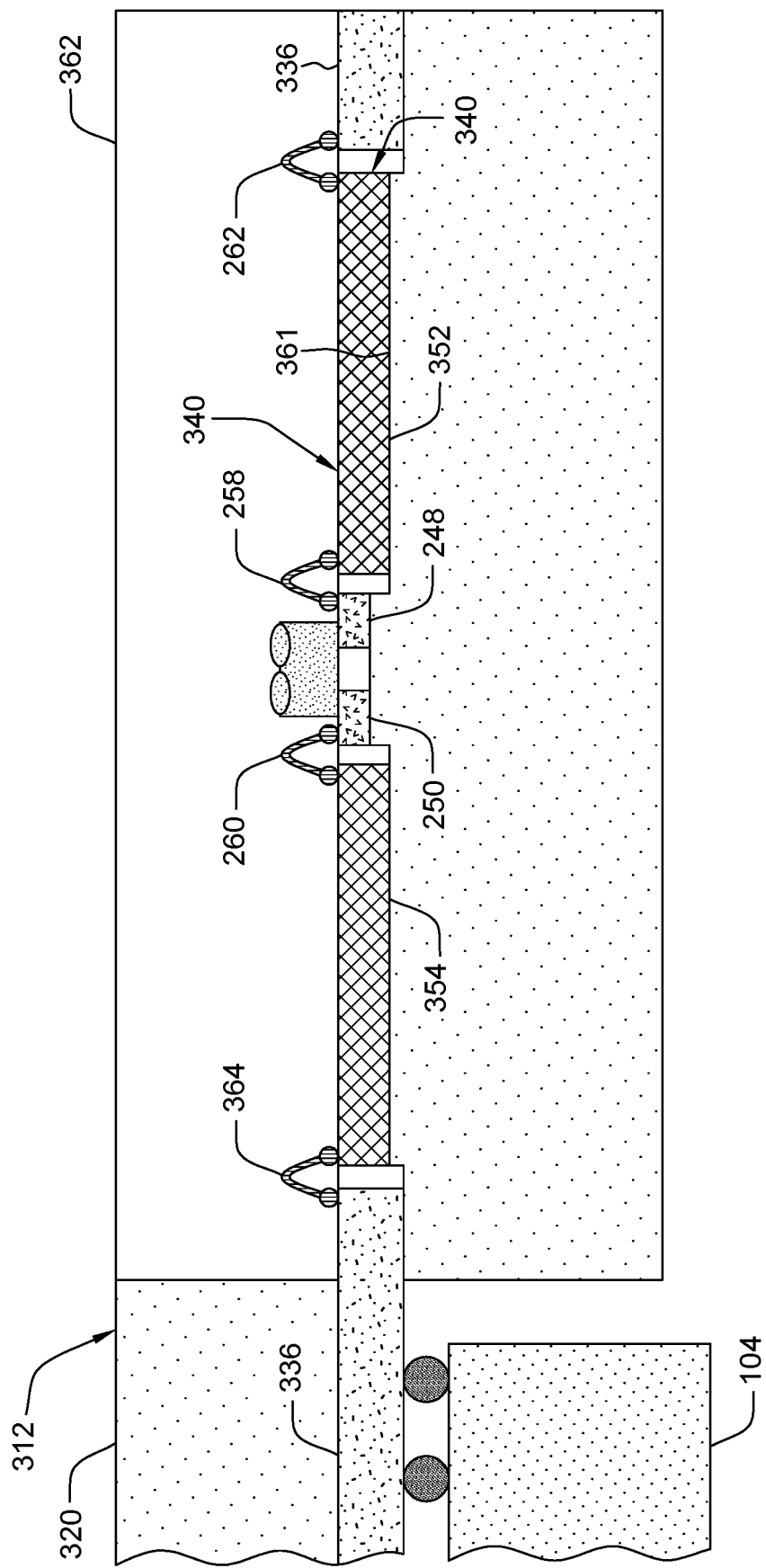
FIG. 3C is a cross-section view of a portion of another alternative optical module of the main circuit board assembly along line 3-3 in FIG. 2A, in accordance with an embodiment of the present disclosure.

FIG. 3C is a cross-section view of a portion of alternative optical module 312 of MCB assembly 100 along line 3-3 in FIG. 2A. In the illustrated embodiment, optical module 312 is similar to optical module 112 (shown in FIG. 3A) and optical module 212 (shown in FIG. 3B) except that optoelectronics assemblage 340 has a wirebond configuration. Thereby, the same reference numerals will be used for optical module 312 where the corresponding components are the same as in optical modules 112 and 212. However, reference numerals that are one hundred higher are used for components of optical module 312 that are different from those in optical module 212, and reference numerals that are two hundred higher are used for components of optical module 312 that are different from those in optical module 112.

In the illustrated embodiment, the wirebond configuration of optical module 312 means that photodiode 248, VCSEL 250, TIA 352, and driver 354 are structurally and thermally connected to pedestal 361 of heat spreader 320, for example, using thermal epoxy. This thermal epoxy can also be electrically conductive and/or two different epoxies can be used. In such embodiments, VCSEL 250 can be connected using thermoelectrical epoxy whereas the other components can be connected using thermal epoxy. Pedestal 361 is a raised boss that extends from the top side of heat spreader 320 and has two levels—a lower one for TIA 352 and driver 354 and an upper one for photodiode 248 and VCSEL 250. Photodiode 248 and TIA 352 are electrically connected via wirebond array 258, and VCSEL 250 and driver 354 are electrically connected via wirebond array 260. Furthermore, TIA 352 is electrically connected to contact array 138 (shown in FIG. 2C) via wirebond array 362 which is connected to traces 147 (shown in FIG. 2C), and driver 354 is electrically connected to contact array 138 via wirebond array 364 which is connected to traces 147. In addition, lenses 256 is optically connected to photodiode 248 and VCSEL 250, and in some embodiments, lenses 256 is structurally connected to photodiode 248 and VCSEL 250.

Figure 4:
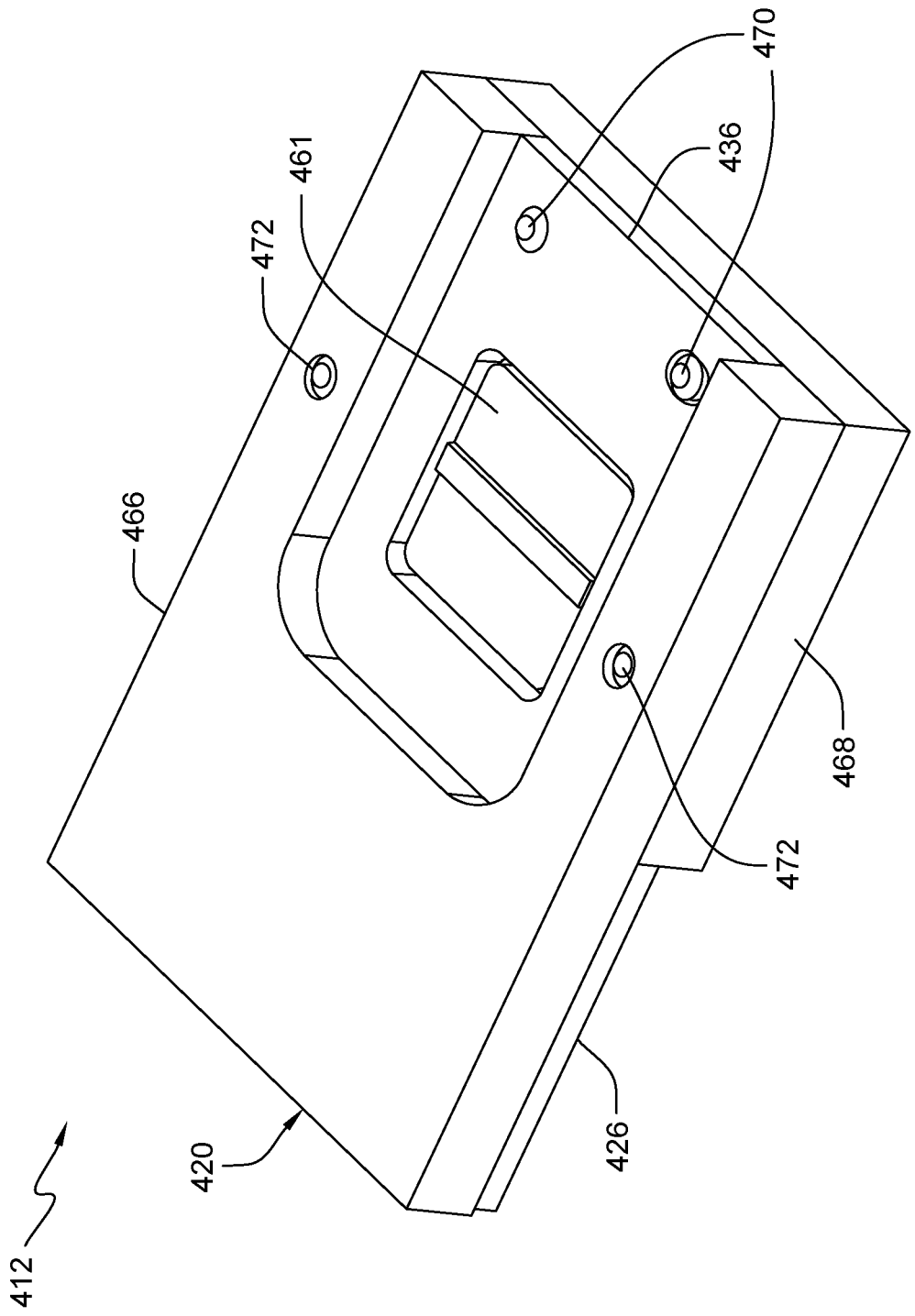
FIG. 4 is a perspective view of an alternative heat spreader, in accordance with an embodiment of the present disclosure.

FIG. 4 is a perspective view of a portion of an alternative optical module 412. In the illustrated embodiment, optical module 412 is similar to optical module 112 (shown in FIG. 3A), optical module 212 (shown in FIG. 3B), and optical module 312 (shown in FIG. 3C) except that optical module 412 has a two-component heat spreader 420 that includes base portion 466 and lip portion 468. Thereby, the same reference numerals will be used for optical module 412 where the corresponding components are the same as in optical modules 112, 212, and 312. However, reference numerals that are one hundred higher are used for components of optical module 412 that are different from those in optical module 312, reference numerals that are two hundred higher are used for components of optical module 412 that are different from those in optical module 212, and reference numerals that are three hundred higher are used for components of optical module 412 that are different from those in optical module 112.

Optical module 412 can include wirebond optoelectronics assemblage 340 (shown in FIG. 3C), although it has been omitted for clarity. In some embodiments, optoelectronics assemblage 340 can be structurally and thermally bonded to pedestal 461, for example, using thermal epoxy. Pedestal 461 is a raised boss that extends from the top side of lip portion 468 and has two levels. Pedestal 470 is surrounded by substrate 436, and substrate 436 is structurally connected to lip portion 468, for example, using glue, epoxy, and/or fasteners 470.

In some embodiments, lip portion 468 is assembled prior to base portion 466 being connected. In such embodiments, base portion 466 can include fasteners 472 (e.g., pins) that extend into holes (not shown) in lip portion 468 (e.g., with a press fit). The connection between base portion 466 and lip portion 468 is both structural and thermal, and thermal epoxy and/or metallic solder can also be used to connect base portion 466 and lip portion 468.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. An optical module for converting communication between optical signals and electrical signals, the optical module comprising:
   an optoelectronic assembly comprising:
     a flat, rigid substrate;
     an array of electrical contacts positioned on a first portion of the substrate; and
     an optoelectronics assemblage that is electrically connected to the array of contacts and is at least partially positioned apart from the array of electrical contacts, wherein the optoelectronics assemblage comprises an integrated circuit and a lens configured for optical communications; and
   a heat spreader comprised of a thermally conductive material, the heat spreader comprising:

a second portion that is structurally connected to the first portion; and a third portion that is thermally connected to the optoelectronics assemblage;

wherein the substrate passes through an aperture in the heat spreader.

2. The optical module of claim 1, wherein the heat spreader is a monolithic component.

3. The optical module of claim 1, wherein the optoelectronics assemblage is offset from a projection of the second portion.

4. The optical module of claim 1, wherein the heat spreader is comprised of a metal material.

5. The optical module of claim 1, wherein the optoelectronics assemblage is configured to be optically connected to a fiber-optic cable.

6. The optical module of claim 1, wherein
the optical module is electrically connected to an integrated circuit of a multi-chip module; and
wherein the second portion of the heat spreader is thermally connected to a heat sink of the multi-chip module, the third portion of the heat spreader being only thermally connected to the heat sink through the second portion.

7. The optical module of claim 6, wherein the multi-chip module is part of a main circuit board assembly.

8. An electronics assembly comprising:
a circuit board comprising:
a substrate;
a die mounted on the substrate;
a heat sink that is thermally connected to the die; and
a thermal lid between the die and the heat sink; and
an optical module for converting communication between optical signals and electrical signals, the optical module comprising:
a heat spreader that is structurally connected to the circuit board and extends from inboard of the substrate to outboard of the substrate thus overlapping the substrate, wherein:
the heat spreader is thermally connected to the heat sink; and
a side of the heat spreader that is thermally connected to the heat sink is coplanar with the surface of the thermal lid that is thermally connected to the heat sink; and
an optoelectronics assemblage that is thermally connected to the heat spreader and is wholly outboard of the substrate thus not overlapping the substrate, wherein the optoelectronics assemblage comprises an integrated circuit and a lens configured for optical communications.

9. The electronics assembly of claim 8, wherein the optical module further comprises:
an optoelectronics assembly comprising:
a substrate;
an array of electrical contacts positioned on a first portion of the substrate; and
the optoelectronics assemblage that is electrically connected to the array of contacts and is positioned apart from the array of electrical contacts; and
wherein the heat spreader is comprised of a thermally conductive material and includes:
a second portion that is structurally connected to the first portion; and
a third portion that is thermally connected to the optoelectronics assemblage.

10. The electronics assembly of claim 9, wherein the substrate of the optoelectronics assembly passes through an aperture in the heat spreader.

11. The electronics assembly of claim 9, wherein the optoelectronics assemblage is offset from a projection of the second portion.

12. The electronics assembly of claim 8, wherein the electronics assembly is a multi-chip module.

13. The electronics assembly of claim 12, wherein the multi-chip module is part of a main circuit board assembly.

* * * * *